US00RE46995E

(19) United States
(12) Reissued Patent
Mokhlesi

(10) Patent Number: US RE46,995 E
(45) Date of Reissued Patent: Aug. 14, 2018

(54) PROGRAMMING NON-VOLATILE STORAGE USING BINARY AND MULTI-STATE PROGRAMMING PROCESSES

(71) Applicant: SanDisk Technologies LLC, Addison, TX (US)

(72) Inventor: Nima Mokhlesi, Los Gatos, CA (US)

(73) Assignee: SANDISK TECHNOLOGIES LLC, Addison, TX (US)

(21) Appl. No.: 14/231,561

(22) Filed: Mar. 31, 2014

Related U.S. Patent Documents

Reissue of:
(64) Patent No.: 8,111,548
Issued: Feb. 7, 2012
Appl. No.: 12/339,005
Filed: Dec. 18, 2008

U.S. Applications:
(60) Provisional application No. 61/082,349, filed on Jul. 21, 2008.

(51) Int. Cl.

| | |
|---|---|
| ***G11C 11/34*** | (2006.01) |
| ***G11C 16/34*** | (2006.01) |
| ***G11C 16/04*** | (2006.01) |
| ***G11C 11/56*** | (2006.01) |
| ***G11C 16/10*** | (2006.01) |

(52) U.S. Cl.
CPC ..... *G11C 16/349* (2013.01); *G11C 11/5628* (2013.01); *G11C 16/0483* (2013.01); *G11C 16/10* (2013.01); *G11C 2211/5641* (2013.01)

(58) Field of Classification Search
CPC . G11C 11/5628; G11C 16/0483; G11C 16/10; G11C 16/349; G11C 2211/5641
USPC ..... 365/185.03, 11, 19, 33
See application file for complete search history.

(56) References Cited

U.S. PATENT DOCUMENTS

| | | | | |
|---|---|---|---|---|
| 5,835,406 | A * | 11/1998 | Chevallier et al. | 365/185.03 |
| 5,930,167 | A * | 7/1999 | Lee et al. | 365/185.03 |
| 5,936,884 | A * | 8/1999 | Hasbun et al. | 365/185.03 |
| 6,456,528 | B1 * | 9/2002 | Chen | 365/185.03 |
| 6,717,847 | B2 | 4/2004 | Chen | |
| 7,310,347 | B2 | 12/2007 | Lasser | |
| 7,388,781 | B2 | 6/2008 | Litsyn | |
| 7,535,764 | B2 * | 5/2009 | Chin | G11C 11/5628 365/185.17 |
| 7,567,457 | B2 * | 7/2009 | Nazarian | G11C 8/08 365/185.05 |
| 8,026,544 | B2 * | 9/2011 | Ito et al. | 257/321 |

(Continued)

OTHER PUBLICATIONS

Office Action dated Mar. 29, 2011, U.S. Appl. No. 12/339,005.

(Continued)

*Primary Examiner* — Behzad Peikari
(74) *Attorney, Agent, or Firm* — Vierra Magen Marcus LLP

(57) ABSTRACT

A non-volatile storage system stores data by programming the data as binary data into blocks that have not yet been programmed with multi-state data and have not yet been programmed with binary data X times. The system transfers data from multiple blocks (source blocks) of binary data to one block (target block) of multi-state data using a multi-state programming process, where the target block has been previously programmed with binary data X times (or less than X times).

39 Claims, 14 Drawing Sheets

(56) References Cited

U.S. PATENT DOCUMENTS

| | | | | |
|---|---|---|---|---|
| 8,027,195 | B2 * | 9/2011 | Li et al. | 365/185.03 |
| 8,111,548 | B2 | 2/2012 | Mokhlesi | |
| 2007/0180346 | A1 | 8/2007 | Murin | |
| 2008/0123412 | A1 | 5/2008 | Lasser | |
| 2008/0259684 | A1 | 10/2008 | Shlick | |
| 2009/0089481 | A1 * | 4/2009 | Kapoor et al. | 711/103 |

OTHER PUBLICATIONS

Response to Office Action dated Aug. 26, 2011, U.S. Appl. No. 12/339,005.

Notice of Allowance dated Nov. 25, 2011, U.S. Appl. No. 12/339,005.

* cited by examiner

Fig. 6A
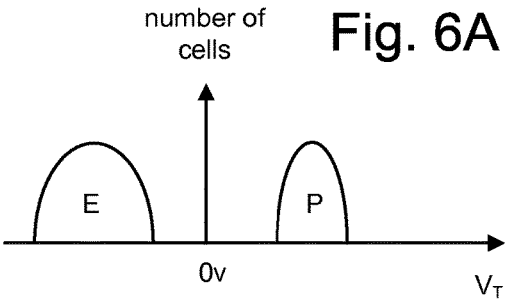
Fig. 6B
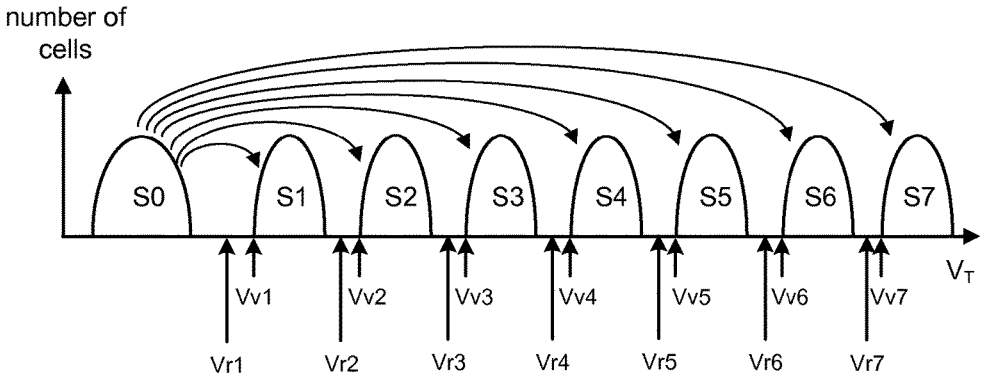
Fig. 8
| | First Page | Second Page | Third Page |
|---|---|---|---|
| **WL0** | 1 | 3 | 6 |
| **WL1** | 2 | 5 | 9 |
| **WL2** | 4 | 8 | 11 |
| **WL3** | 7 | 10 | 12 |

Fig 15 block # operation #

| | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 1 | b1 | | | | | | | | | | | | | | |
| 2 | b1 | b1 | | | | | | | | | | | | | |
| 3 | b1 | b1 | b1 | | | | | | | | | | | | |
| 3 | | | | ms | | | | | | | | | | | |
| 4 | b2 | | | ms | | | | | | | | | | | |
| 5 | b2 | b2 | | ms | | | | | | | | | | | |
| 6 | b2 | b2 | b2 | ms | | | | | | | | | | | |
| 6 | | | | ms | ms | | | | | | | | | | |
| 7 | b3 | | | ms | ms | | | | | | | | | | |
| 8 | b3 | b3 | | ms | ms | | | | | | | | | | |
| 9 | b3 | b3 | b3 | ms | ms | | | | | | | | | | |
| 9 | | | | ms | ms | ms | | | | | | | | | |
| 10 | | | | ms | ms | ms | b1 | | | | | | | | |
| 11 | | | | ms | ms | ms | b1 | b1 | | | | | | | |
| 12 | | | | ms | ms | ms | b1 | b1 | b1 | | | | | | |
| 12 | ms | | | ms | ms | ms | | | | | | | | | |
| 13 | ms | | | ms | ms | ms | b2 | | | | | | | | |
| 14 | ms | | | ms | ms | ms | b2 | b2 | | | | | | | |
| 15 | ms | | | ms | ms | ms | b2 | b2 | b2 | | | | | | |
| 15 | ms | ms | | ms | ms | ms | | | | | | | | | |
| 16 | ms | ms | | ms | ms | ms | b3 | | | | | | | | |
| 17 | ms | ms | | ms | ms | ms | b3 | b3 | | | | | | | |
| 18 | ms | ms | | ms | ms | ms | b3 | b3 | b3 | | | | | | |
| 18 | ms | ms | ms | ms | ms | ms | | | | | | | | | |
| 19 | ms | ms | ms | ms | ms | ms | | | | b1 | | | | | |
| 20 | ms | ms | ms | ms | ms | ms | | | | b1 | b1 | | | | |
| 21 | ms | ms | ms | ms | ms | ms | | | | b1 | b1 | b1 | | | |
| 21 | ms | ms | ms | ms | ms | ms | ms | | | | | | | | |
| 22 | ms | ms | ms | ms | ms | ms | ms | | | b2 | | | | | |
| 23 | ms | ms | ms | ms | ms | ms | ms | | | b2 | b2 | | | | |
| 24 | ms | ms | ms | ms | ms | ms | ms | | | b2 | b2 | b2 | | | |
| 24 | ms | ms | ms | ms | ms | ms | ms | ms | | | | | | | |
| 25 | ms | ms | ms | ms | ms | ms | ms | ms | | b3 | | | | | |
| 26 | ms | ms | ms | ms | ms | ms | ms | ms | | b3 | b3 | | | | |
| 27 | ms | ms | ms | ms | ms | ms | ms | ms | | b3 | b3 | b3 | | | |
| 27 | ms | ms | ms | ms | ms | ms | ms | ms | ms | | | | | | |
| 28 | ms | ms | ms | ms | ms | ms | ms | ms | ms | | | | b1 | | |
| 29 | ms | ms | ms | ms | ms | ms | ms | ms | ms | | | | b1 | b1 | |
| 30 | ms | ms | ms | ms | ms | ms | ms | ms | ms | | | | b1 | b1 | b1 |
| 30 | ms | ms | ms | ms | ms | ms | ms | ms | ms | ms | | | | | |

PROGRAMMING NON-VOLATILE STORAGE USING BINARY AND MULTI-STATE PROGRAMMING PROCESSES

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

This application claims priority to U.S. Provisional Application 61/082,349, "Programming Non-Volatile Storage Using Binary And Multi-State Programming Processes," filed on Jul. 21, 2008.

BACKGROUND

1. Field

The present invention relates to technology for non-volatile storage.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Some EEPROM and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate. Thus, a memory cell (which can include one or more transistors) can be programmed and/or erased by changing the level of charge on a floating gate in order to change the threshold voltage.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self Boosting Technique For Non-Volatile Memory," and in U.S. Patent Application Publication 2005/0024939, titled "Detecting Over Programmed Memory," both of which are incorporated herein by reference in their entirety. In many devices, the program voltage applied to the control gate during a program operation is applied as a series of pulses in which the magnitude of the pulses is increased by a predetermined step size for each successive pulse.

Each memory cell can store data (analog or digital). When storing one bit of digital data (referred to as a binary data), possible threshold voltages of the memory cell are divided into two ranges which are assigned logical data "1" and "0." In one example, the threshold voltage is negative after the memory cell is erased, and defined as logic "1." After programming, the threshold voltage is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple levels of information (referred to as a multi-state data). In the case of multi-state data, the range of possible threshold voltages is divided into the number of levels of data. For example, if four levels of information is stored, there will be four threshold voltage ranges assigned to the data values "11", "10", "01", and "00." In one example, the threshold voltage after an erase operation is negative and defined as "11." Positive threshold voltages are used for the states of "10", "01", and "00." If eight levels of information (or states) are stored in each memory cell (e.g. for three bits of data per memory cell), there will be eight threshold voltage ranges assigned to the data values "000", "001", "010", "011" "100", "110" and "111." The specific relationship between the data programmed into the memory cell and the threshold voltage levels of the memory cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted to reduce data pattern sensitivity and even wearing.

Memory cells storing multi-state data can store more data than memory cells storing binary data; therefore, the cost per bit is smaller. However, memory cells storing multi-state data program slower than memory cells storing binary data because memory cells storing multi-state data program to multiple target threshold voltage ranges and require a higher level of precision during programming than memory cells storing binary data because the extra threshold voltage ranges need to be narrow enough to remain distinct.

SUMMARY

A non-volatile storage system is provided that first stores data as binary data so that the user experiences a fast programming experience. Subsequently, the binary data is reprogrammed as multi-state data.

In one embodiment, the memory is divided into blocks (or other units). To allow for even wearing, blocks will generally be used X times to store binary data and then they will be used to store multi-state data.

One embodiment includes receiving requests to program and receiving the data to be programmed for the requests, programming the data as binary data into blocks that have not yet been programmed with multi-state data and have not yet been programmed with binary data X times, updating programming cycle counters for the blocks, transferring data from multiple blocks (source blocks) of binary data to one block (target block) of multi-state data using a multi-state programming process (where the target block has been previously programmed with binary data X times), and marking source blocks as available for programming.

Subsequent to programming the data as multi-state data, the data can be read many times (including hundreds or thousands of times). In one embodiment, the memory system can serve as a write once (or few times) and read many times storage system that is used for long term storage (e.g., archive).

One embodiment includes programming data as binary data into units of non-volatile storage elements that have not yet been programmed with multi-state data and have not yet been programmed with binary data X times. The process further includes transferring data from multiple units of non-volatile storage elements storing binary data to one target unit of non-volatile storage elements storing multi-state data using a multi-state programming process after the target unit has been previously programmed with binary data X times.

One embodiment includes receiving one or more requests to program, receiving data to be programmed for the one or more requests, programming (in response to the one or more requests to program) the data as binary data into units of non-volatile storage elements that have not yet been programmed with multi-state data and have not yet been programmed with binary data X times, updating programming cycle counters for the units of non-volatile storage elements, identifying a target unit of non-volatile storage elements that has been previously programmed with binary data X times, combining data from multiple units of non-volatile storage elements storing binary data, storing the combined data in the target unit of non-volatile storage elements as multi-state data using a multi-state programming process, and marking the multiple units as available for additional binary programming if the multiple units have not yet been programmed with binary data X times.

One embodiment includes a plurality of non-volatile storage elements and one or more control circuits in communication with the non-volatile storage elements. The one or more control circuits identify a first set of units of the non-volatile storage elements that have not yet been programmed with multi-state data and have not yet been programmed with binary data X times. The one or more control circuits program first data as binary data into the first set of units of the non-volatile storage elements. The one or more control circuits identify a target unit of non-volatile storage elements that has been previously programmed with binary data X times. The one or more control circuits combine the first data from the first set of units of non-volatile storage elements and store the combined data in the target unit of non-volatile storage elements as multi-state data. The one or more control circuits can read the data many times from the target unit of non-volatile storage elements.

FIG. [6] *6A* depicts an example set of threshold voltage distributions and describes a process for programming non-volatile memory.

FIG. [6A] *6B* depicts an example set of threshold voltage distributions and describes a process for programming non-volatile memory.

FIGS. 7A-I show various threshold voltage distributions and describe a process for programming non-volatile memory.

FIG. 8 is a table depicting one example of an order of programming non-volatile memory.

FIGS. 9A-E show various threshold voltage distributions and describe a process for programming non-volatile memory.

Figure 10:
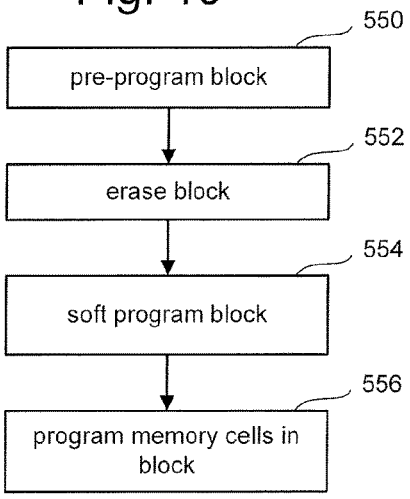

FIG. 10 depicts a flow chart describing one embodiment of a process for programming non-volatile memory.

Figure 11:
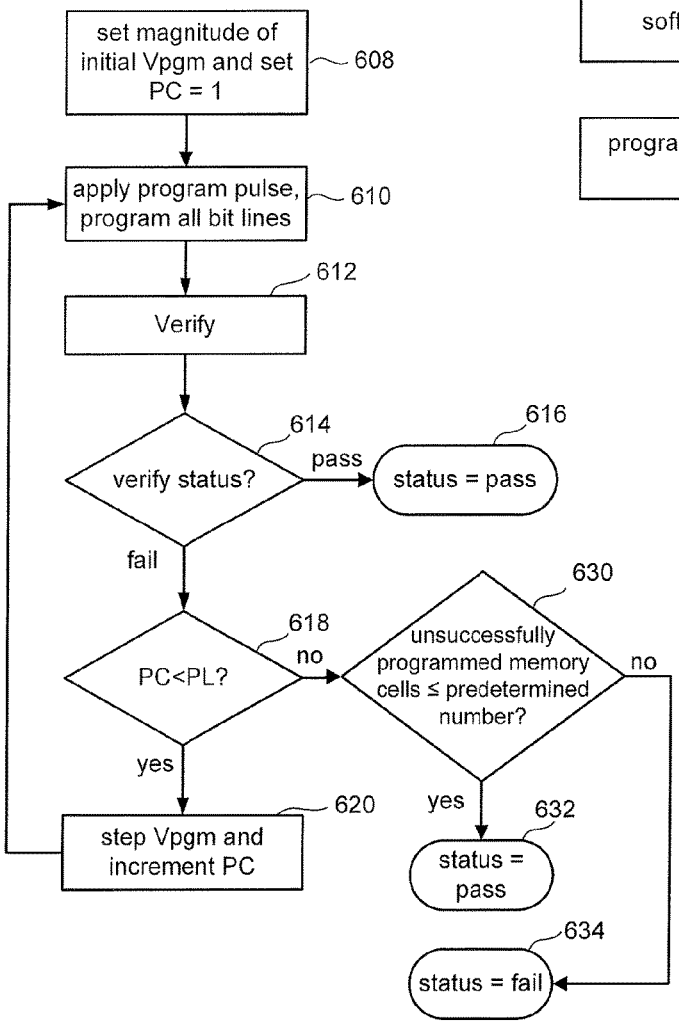

FIG. 11 depicts a flow chart describing one embodiment of a process for programming non-volatile memory elements.

Figure 12:
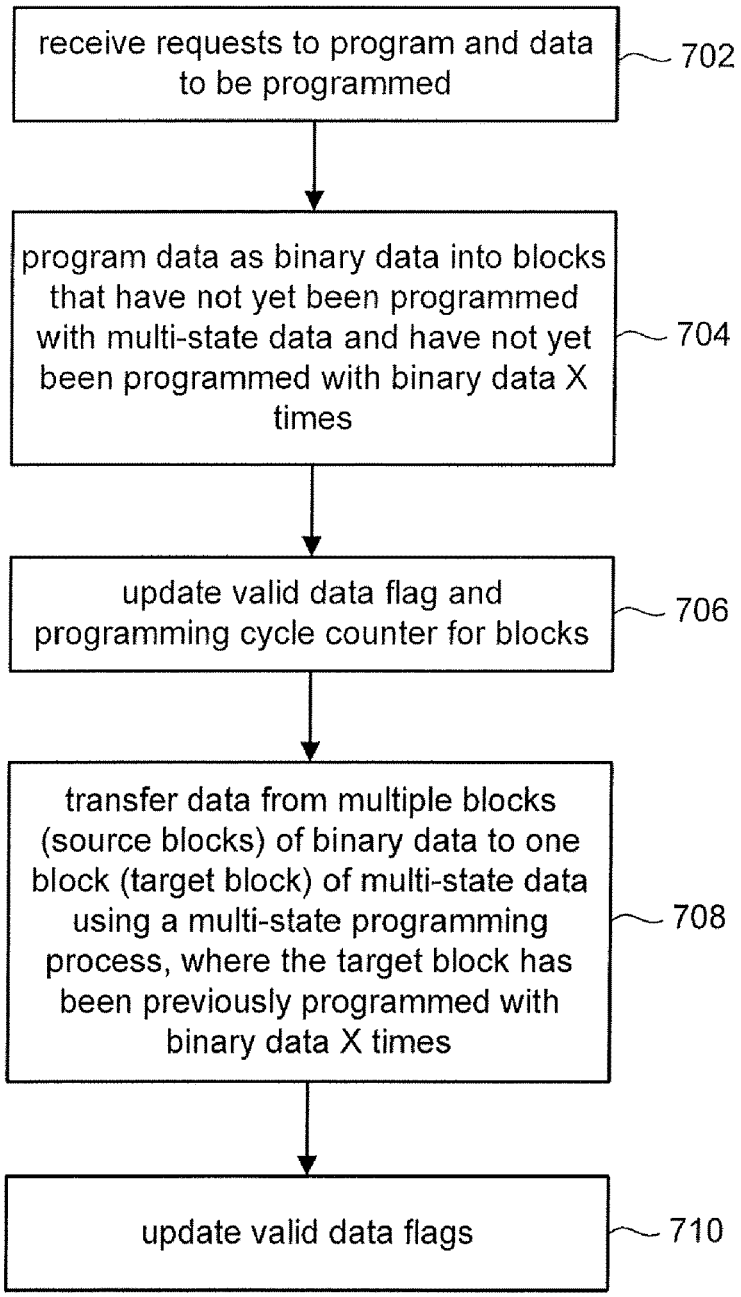

FIG. 12 is a flow chart describing one embodiment of a process of for programming non-volatile memory elements using a binary programming process and a multi-state programming process.

Figure 13:
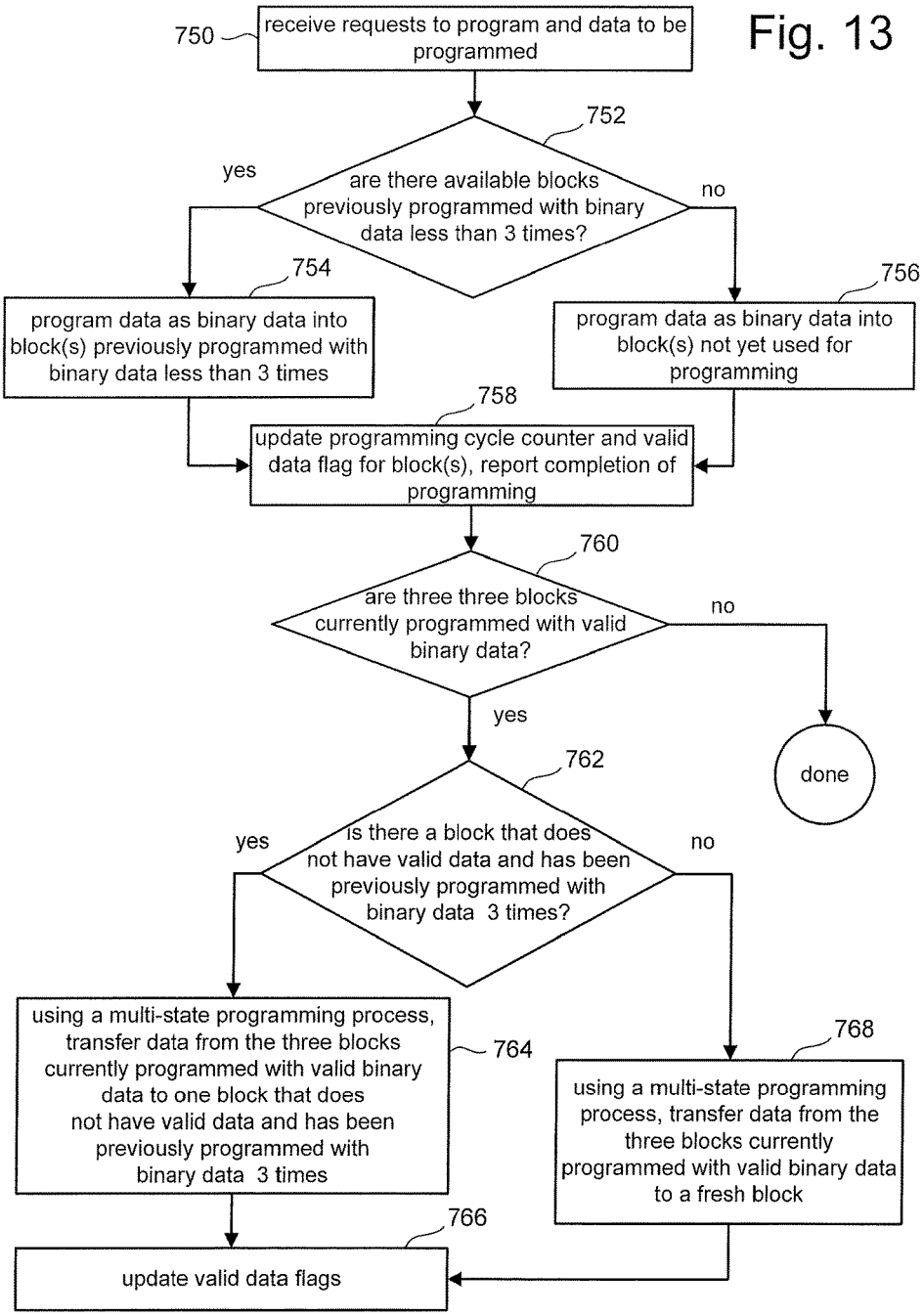

FIG. 13 is a flow chart describing one embodiment of a process of for programming non-volatile memory elements using a binary programming process and a multi-state programming process.

Figure 14A:
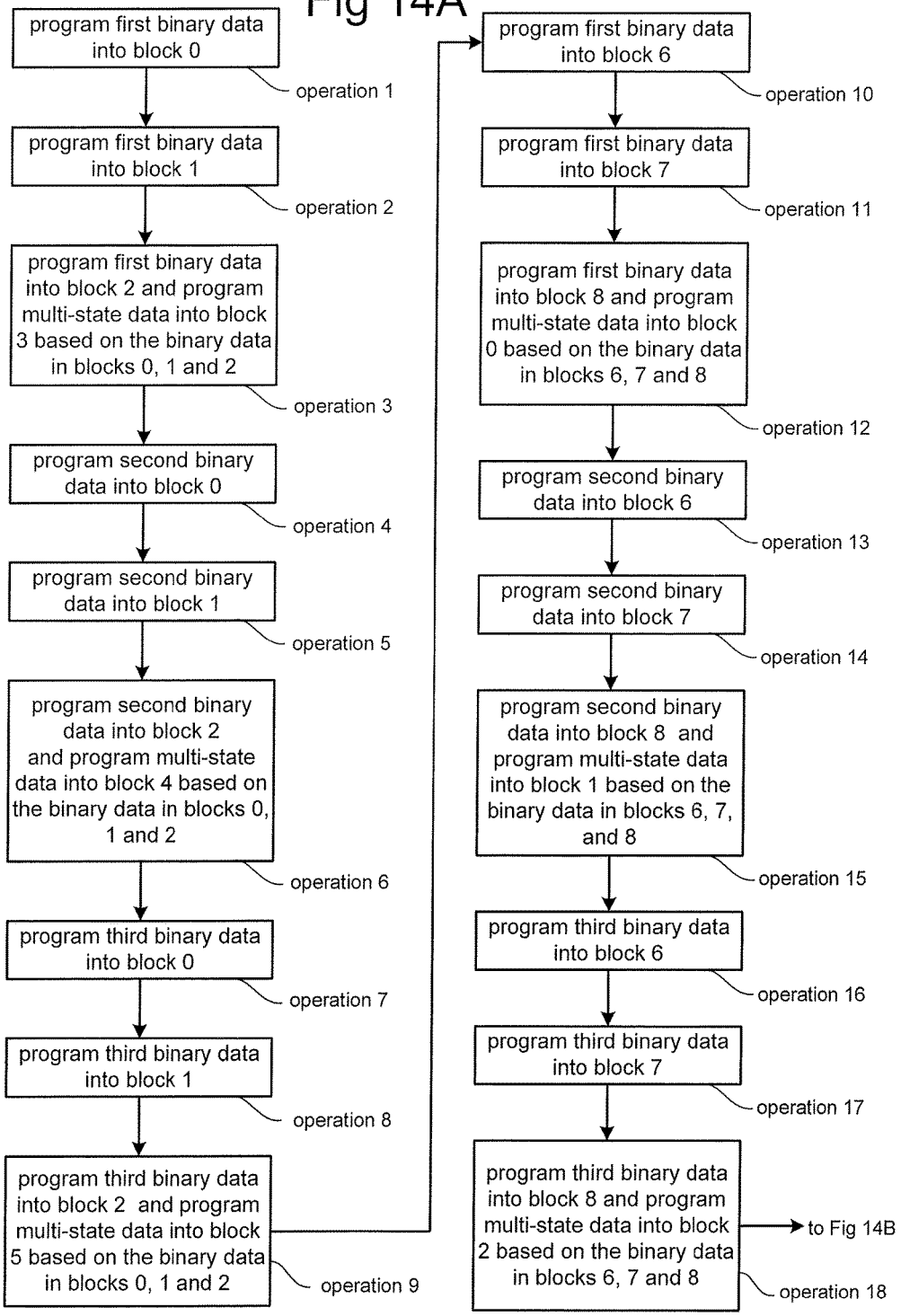
Figure 14B:
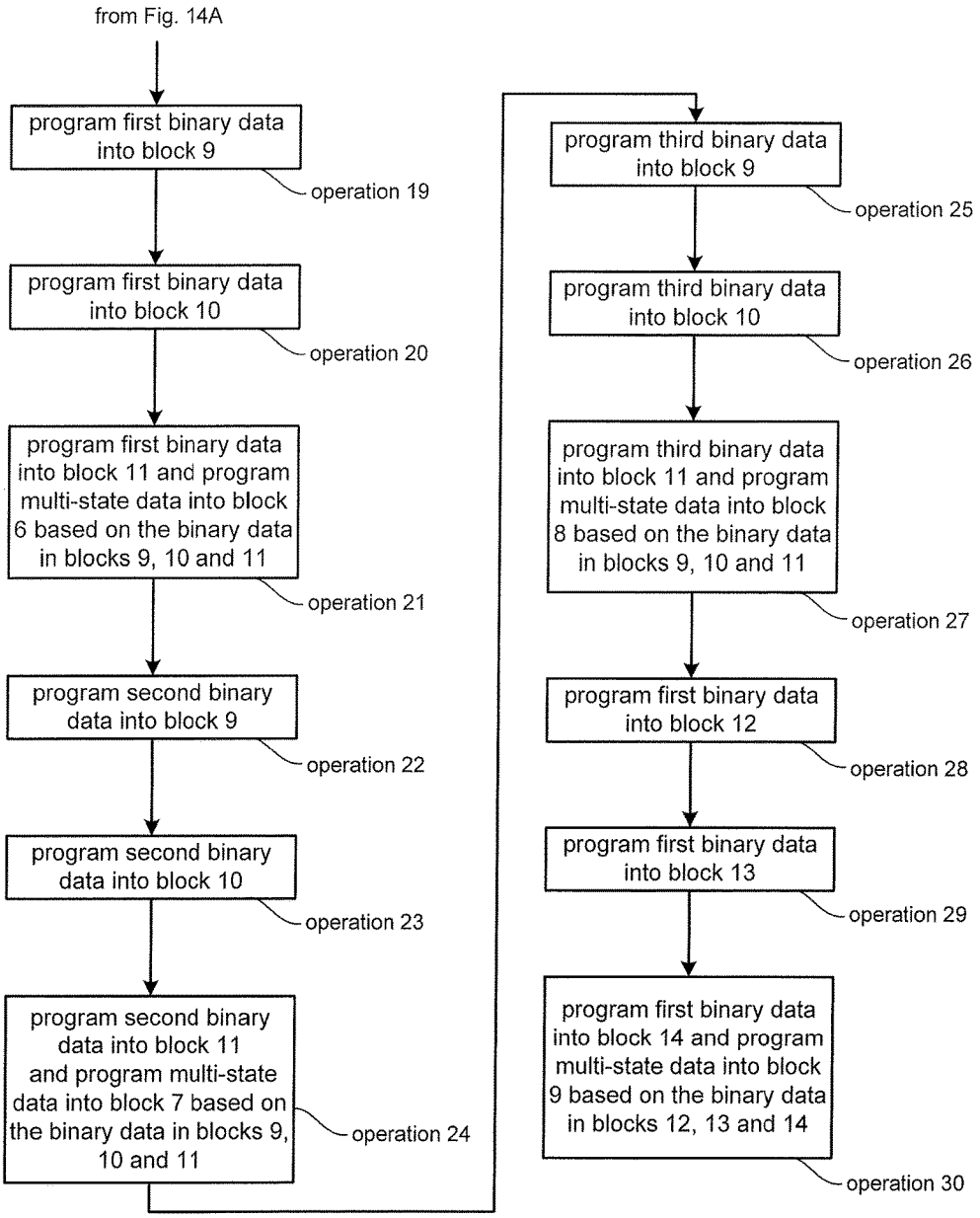

FIGS. 14A and 14B depict a flow chart describing one embodiment of a process of for programming non-volatile memory elements using a binary programming process and a multi-state programming process.

FIG. 15 is a table depicting the order of programming block of memory.

DETAILED DESCRIPTION

Figure 1:
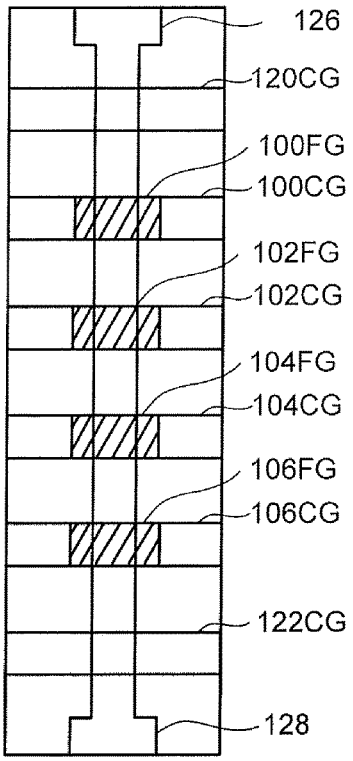
FIG. 1 is a top view of a NAND string.
Figure 2:
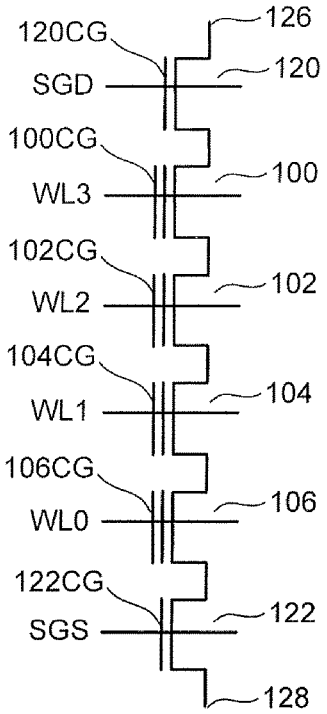
FIG. 2 is an equivalent circuit diagram of the NAND string.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Relevant examples of NAND type flash memories and their operation are provided in the following U.S. Patents/Patent Applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348.

Other types of non-volatile storage devices can also be used, including memory cells that do not use floating gates. For example, nonvolatile memory devices are also manufactured from memory cells that use a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric. Other types of non-volatile storage can also be used.

Figure 3:
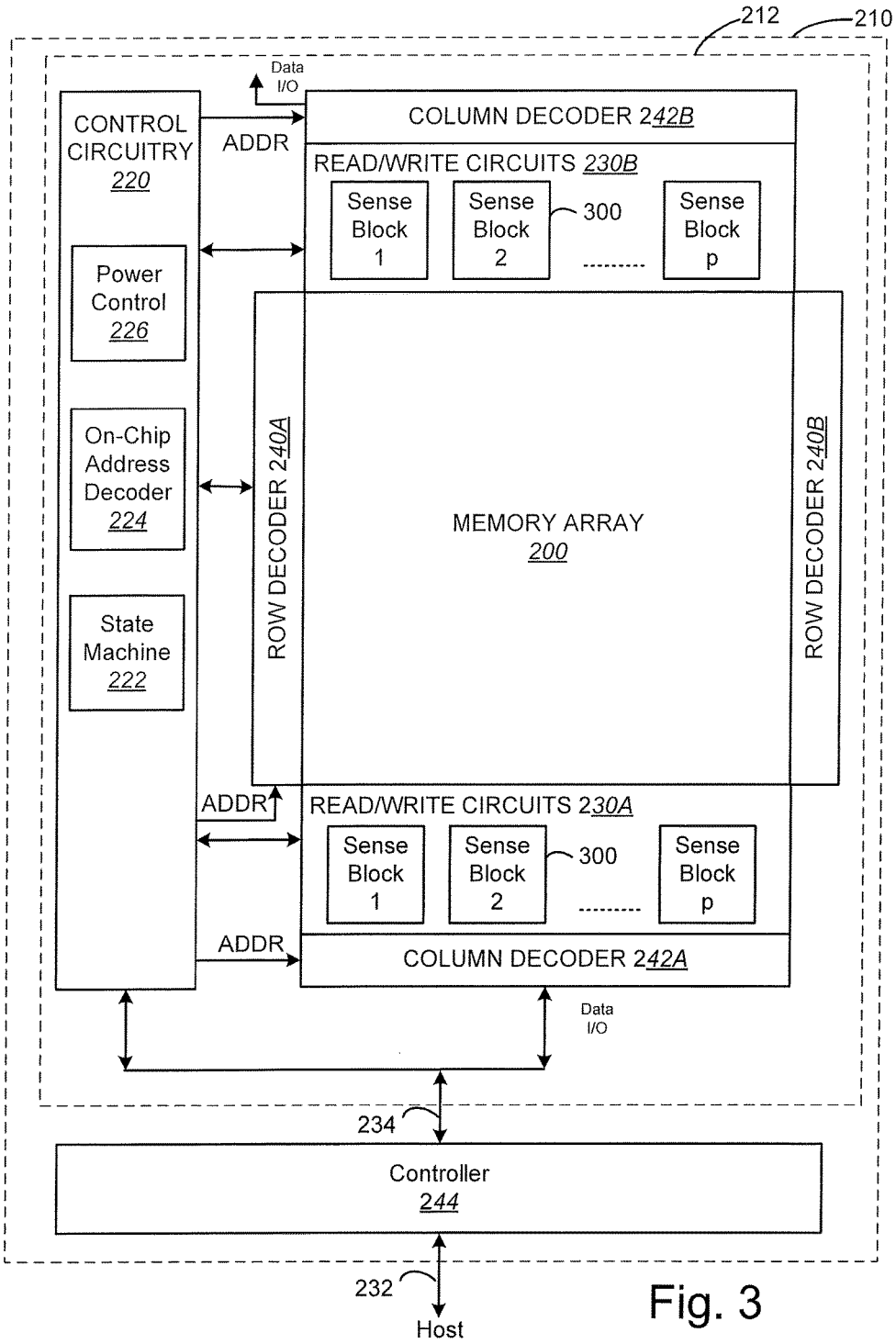
FIG. 3 is a block diagram of a non-volatile memory system.

FIG. 3 illustrates a memory device 210 having read/write circuits for reading and programming memory cells (e.g., NAND multi-state flash memory or other type of non-volatile memory) in parallel. Memory device 210 may include one or more memory die or chips 212. Memory die 212 includes an array (two-dimensional or three dimensional) of non-volatile memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half The read/write circuits 230A and 230B include multiple sense blocks 300 which allow a page (or other unit) of memory cells to be read or programmed in parallel. The memory array 200 is addressable by word lines via row decoders 240A and 240B and by bit lines via column decoders 242A and 242B. Word lines and bit lines are examples of control lines. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing or control circuits. The one or more managing or control circuits perform the processes described herein.

Figure 4:
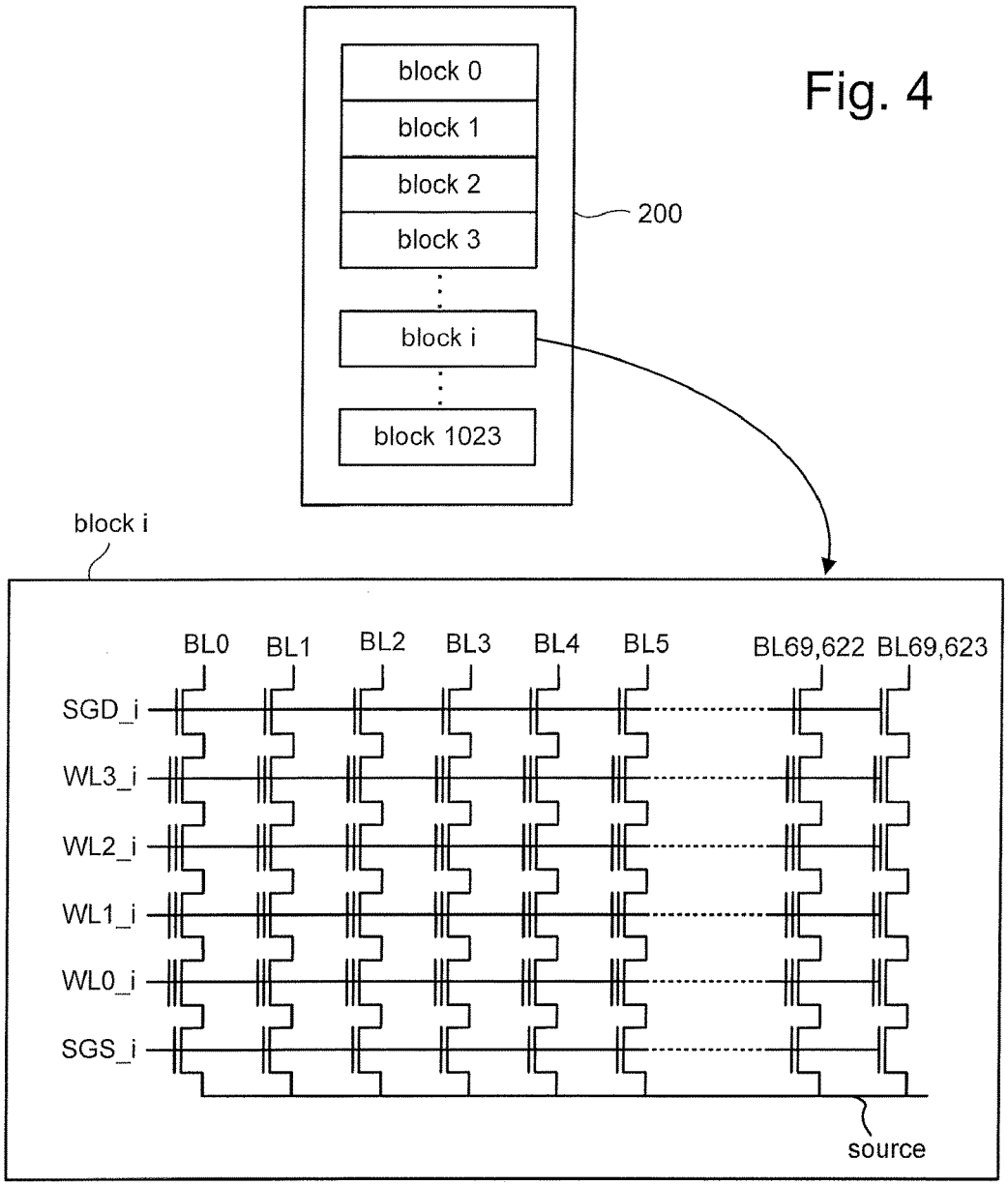
FIG. 4 is a block diagram depicting one embodiment of a memory array.

FIG. 4 depicts an exemplary structure of memory cell array 200. In one embodiment, the array of memory cells is divided into a large number of blocks (e.g., blocks 0-1023, or another amount) of memory cells. As is common for flash EEPROM systems, the block is the unit of erase. That is, each block contains the minimum number of memory cells that are erased together. Other units of erase can also be used.

A block contains a set of NAND stings which are accessed via bit lines (e.g., bit lines BL0-BL69,623) and word lines (WL0, WL1, WL2, WL3). FIG. 4 shows four memory cells connected in series to form a NAND string. Although four cells are depicted to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS). Although FIG. 4 shoes 69624 bit lines, a different number of bit lines can also be used.

Each block is typically divided into a number of pages. In one embodiment, a page is a unit of programming. Other units of programming can also be used. One or more pages of data are typically stored in one row of memory cells. For example, one or more pages of data may be stored in memory cells connected to a common word line. A page can store one or more sectors. A sector includes user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages and sectors can also be used.

Figure 5:
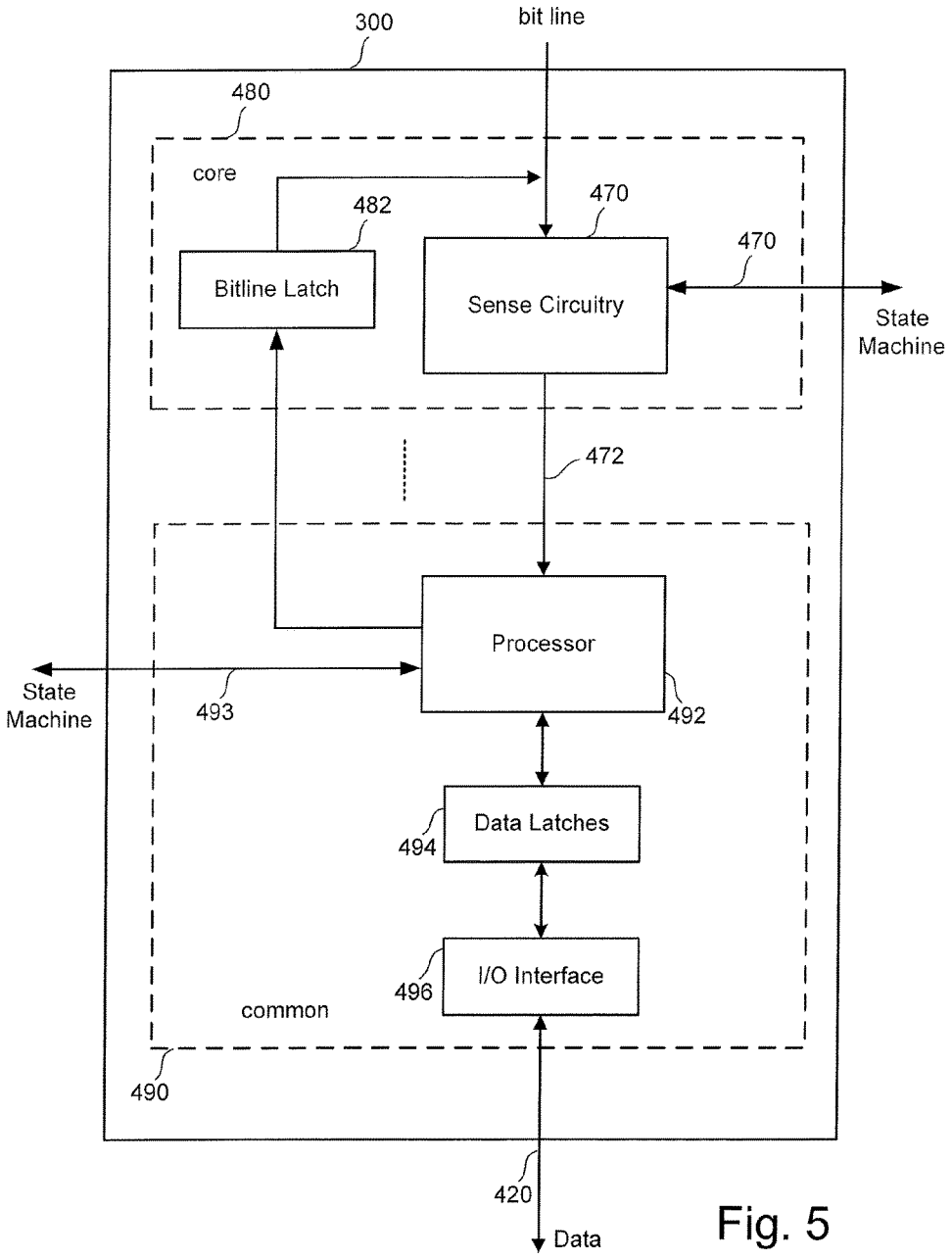
FIG. 5 is a block diagram depicting one embodiment of a sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. One example can be found in U.S. Patent Application Publication 2006/0140007, which is incorporated herein by reference in its entirety.

Sense module 480 comprises sense circuitry 470 that determines whether a conduction current in a connected bit line is above or below a predetermined level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls (using power control 226) the supply of different control gate voltages to the addressed memory cell(s). As it steps through the various predefined control gate voltages corresponding to the various memory states supported by the memory, the sense module 480 may trip at one of these voltages and an output will be provided from sense module 480 to processor 492 via bus 472. Processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

Data latch stack 494 contains a stack of data latches corresponding to the sense module. In one embodiment, there are three (or four or another number) data latches per sense module 480. In one embodiment, the latches are each one bit.

During program or verify, the data to be programmed is stored in the set of data latches 494 from the data bus 420. During the verify process, Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the sensing operations and sense amplifiers can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) United States Patent Application Pub. No. 20050169082; (4) United States Patent Application Publication 2006/0221692, titled "Compensating for Coupling During Read Operations of Non-Volatile Memory," Inventor Jian Chen, filed on Apr. 5, 2005; and (5) United States Patent Application Publication 2006/0158947 titled "Reference Sense Amplifier For Non-Volatile Memory, filed on Dec. 28, 2005. All five of the immediately above-listed patent documents are incorporated herein by reference in their entirety.

At the end of a successful programming process (with verification), the threshold voltages of the memory cells should be within one or more distributions of threshold voltages for programmed memory cells or within a distribution of threshold voltages for erased memory cells, as appropriate.

FIG. [6] *6A* illustrates example threshold voltage distributions (also called data states) for the memory cell array when each memory cell stores binary data. Two data states are depicted: state E and state P. State E corresponds to memory cells that are erased. State P corresponds to memory cells that are programmed. In one embodiment, state E corresponds to distribution of threshold voltages below 0 volts and state P corresponds to distribution of threshold voltages above 0 volts. In other embodiments, both states can be above zero volts or both can be below zero volts. In one example, memory cells of a block are erased. Those memory cells that are to store data "1" will remain erased in state E. Those memory cells that are to store data "0" will be programmed to state P. In other embodiments, state E can store data "0" and state P can store data "1."

FIG. [6A] *6B* illustrates example threshold voltage distributions (also called data states) for the memory cell array when each memory cell stores three bits of multi-state data. Other embodiment, however, may use more or less than three bits of data per memory cell (e.g., such as four or more bits of data per memory cell).

In the example of FIG. [6A] *6B*, each memory cell stores three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state corresponds to a unique value for the three bits stored in the memory cell. In one embodiment, S0=111, S1=110, S2=101, S3=100, S4=011, S5=010, and S7=000. Other mapping of data to states S0-S7 can also be used. In one embodiment, all of the bits of data stored in a memory cell are stored in the same logical page. In other embodiments, each bit of data stored in a memory cell corresponds to different logical pages. Thus, a memory cell storing three bits of data would include data in a first page, data in a second page and data in a third page. In some embodiments, all of the memory cells connected to the same word line would store data in the same three pages of data. In some embodiments, the memory cells connected to a word line can be grouped into different sets of pages (e.g., by odd and even bit lines, or by other arrangements).

In some prior art devices, the memory cells will be erased to state S0. From state S0, the memory cells can be programmed to any of states S1-S7. In one embodiment, known as full sequence programming, memory cells can be programmed from the erased state S0 directly to any of the programmed states S1-S7. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, and state S0 to state S7. Full sequence programming is graphically depicted by the seven curved arrows of FIG. 6A FIG. [6A] *6B* shows a set of target verify levels Vv1, Vv2, Vv3, Vv4, Vv5, Vv6, and Vv7. These target verify levels are used as comparison levels during the programming process. For example, when programming memory cells to state 1, the system will check to see if the threshold voltages of the memory cells have reached Vv1. If the threshold voltage of a memory cell has not reached Vv1, then programming will continue for that memory cell until its threshold voltage is greater than or equal to Vv1. If the threshold voltage of a memory cell has reached Vv1, then programming will stop for that memory cell. Target verify level Vv2 is used for memory cells being programmed to state 2. Target verify level Vv3 is used for memory cells being programmed to state 3. Target verify level Vv4 is used for memory cells being programmed to state 4. Target verify level Vv5 is used for memory cells being programmed to state 5. Target verify level Vv6 is used for memory cells being programmed to state 6. Target verify level Vv7 is used for memory cells being programmed to state 7.

FIG. [6A] *6B* also shows a set of read compare levels Vr1, Vr2, Vr3, Vr4, Vr5, Vr6, and Vr7. These read compare levels are used as comparison levels during the read process. By testing whether the memory cells turn on or remain off in response to the read compare levels Vr1, Vr2, Vr3, Vr4, Vr5, Vr6, and Vr7 being separately applied to the control gates of the memory cells, the system can determine which states the memory cells are in.

FIGS. 7A-7I disclose another process for programming multi-state data. Prior to the first step, the memory cells will be erased so that they are in the erase threshold distribution of state S0. The process of FIGS. 7A-7I assumes that each memory cell stores three bits of data, with each bit being in a different page. The first bit of data (the leftmost bit) is associated with the first page. The middle bit is associated with the second page. The rightmost bit is associated with the third page. In one embodiment, the correlation of data states to data is as follows: S0=111, S1=110, S2=101, S3=100, S4=011, S5=010, S6=001 and S7=000. However, other embodiments can use other data encoding schemes.

Figure 7A:
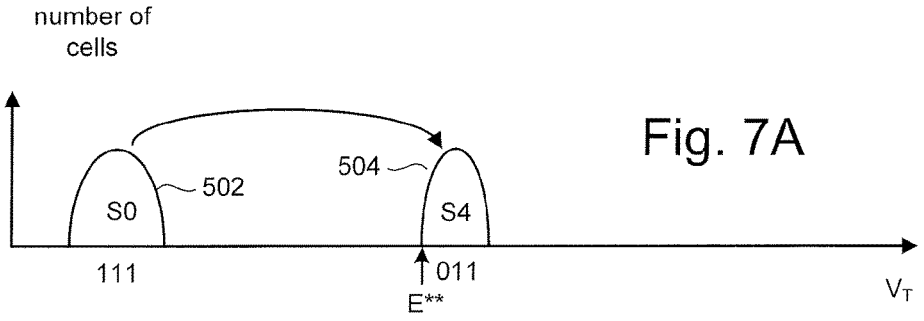
Figure 7B:
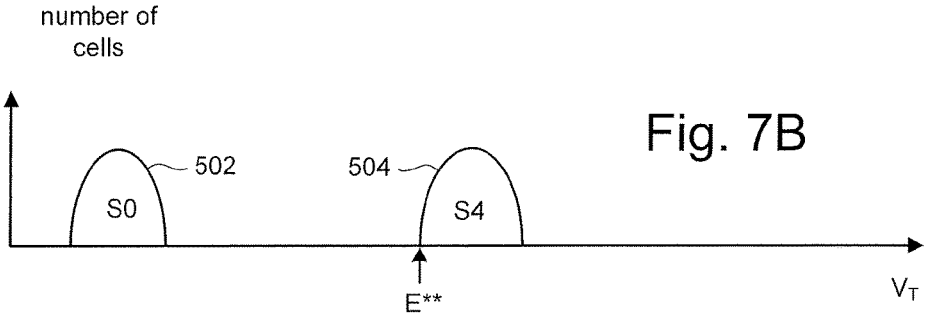

When programming the first page (as described in FIG. 7A), if the bit is to be data "1" then the memory cell will stay in state S0 (threshold voltage distribution 502). If the first bit is to be data "0" then the memory cell is programmed to state S4 (threshold voltage distribution 504). After adjacent memory cells are programmed, capacitive coupling between adjacent floating gates may cause the state S4 to widen as depicted in FIG. 7B. State S0 may also widen, but there is sufficient margin between S0 and S1 to ignore the effect. More information about capacitive coupling between adjacent floating gates can be found in U.S. Pat. No. 5,867,429 and U.S. Pat. No. 6,657,891, both of which are incorporated herein by reference in their entirety.

Figure 7C:
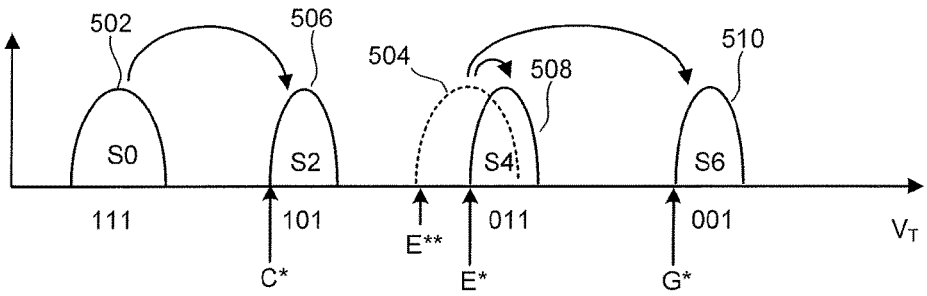

When programming the second page (see FIG. 7C), if the memory cell is in state S0 and the second page bit is data "1" then the memory cell stays in state S0. In some embodiments, the programming process for the second page will tighten threshold voltage distribution 502 to a new S0. If the memory cell was in state S0 and the data to be written to the second page is "0," then the memory cell is moved to state S2 (threshold voltage distribution 506). At this point, state S2 has a verify point (lowest voltage) of C*. If the memory cell was in state S4 and the second page data to be written to the memory cell is "1" then the memory cell remains in S4. However, state S4 is tightened by moving the memory cells from threshold voltage distribution 504 to threshold voltage distribution 508 for state S4, as depicted in FIG. 7C. Threshold voltage distribution 508 has a verify point of E* (as compared to E of threshold voltage distribution 504). If the memory cell is in state S4 and the data to be written to the second page is a "0" then the memory cell has its threshold voltage moved to state S6 (threshold voltage distribution 510**), with a verify point of G*.

Figure 7D:
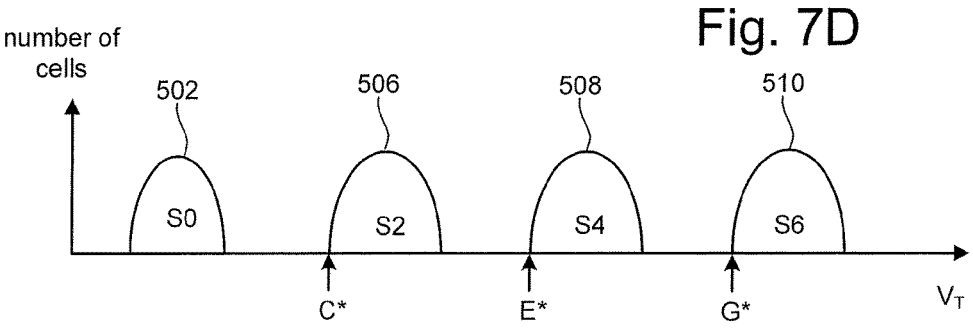

After the adjacent memory cells are programmed, the states S2, S4 and S6 are widened due to the floating gate to floating gate coupling, as depicted by threshold voltages distributions 506, 508 and 510 of FIG. 7D. In some cases, state S0 may also widen.

Figure 7E:
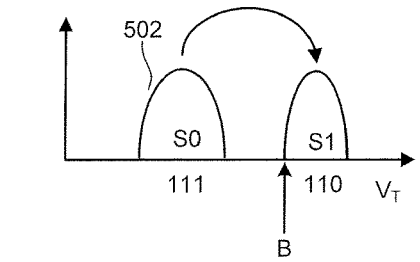
Figure 7F:
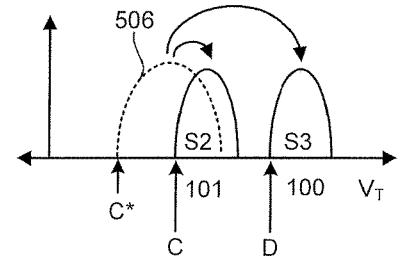
Figure 7G:
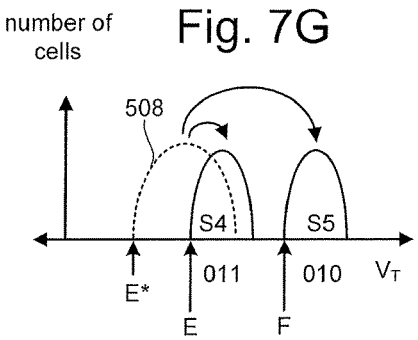
Figure 7H:
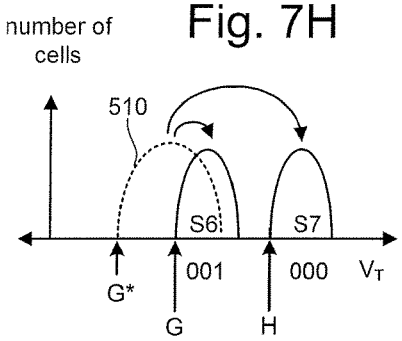
Figure 7I:
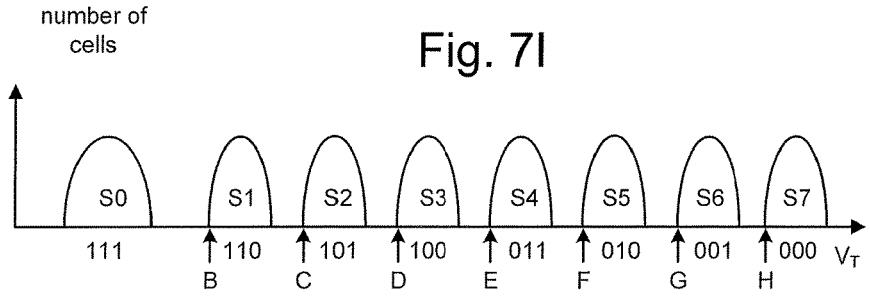

FIGS. 7E, 7F, 7G and 7H depict the programming of the third page of data. While one graph can be used to show the programming, the process is depicted in four graphs for visibility reasons. After the second page has been programmed, the memory cells are either in states S0, S2, S4 or S6. FIG. 7E shows the memory cells that are in state S0 being programmed for the third page. FIG. 7F shows the memory cells that are in state S2 being programmed for the third page. FIG. 7G shows the memory cells that are in state S4 being programmed for the third page. FIG. 7H shows the memory cells that are in state S6 being programmed for the third page. FIG. 7I shows the threshold voltage distributions after the processes of FIGS. 7E, 7F, 7G and 7H have been performed on the population of memory cells (concurrently or serially).

If a memory cell is in state S0 and the third page data is "1" then the memory cell remains in state S0. If the data for the third page is "0" then the threshold voltage for the memory cell is raised to be in state S1, with a verify point of B (see FIG. 7E).

If a memory cell is in state S2 and the data to be written in the third page is "1," then the memory cell will remain in state S2 (see FIG. 7F). However, some programming will be performed to tighten the threshold distribution 506 to a new state S2 with a verify point of C volts. If the data to be written to the third page is "0," then the memory cell will be programmed to state S3, with a verify point of D volts.

If a memory cell is in state S4 and the data to be written to the third page is "1" then the memory cell will remain in state S4 (see FIG. 7G). However, some programming will be performed so that threshold voltage distribution 508 will be tightened to new state S4 with a verify point of E. If a memory cell is in state S4 and the data to be written to the third page is "0" then the memory cell will have its threshold voltage raised to be in state S5, with a verify point of F (see FIG. 7G).

If the memory cell is in state S6 and the data to be written to the third page is "1" then the memory cell will remain in state S6 (see FIG. 7H). However, there will be some programming so that the threshold voltage distribution 510 is tightened to be in new state S6, with a verify point at G. If the third page data is "0" then the memory cell will have its threshold voltage programmed to state S7, with a verify point at H (see FIG. 7H). At the conclusion of the programming of the third page, the memory cell will be in one of the eight states depicted in FIG. 7I.

FIG. 8 depicts one example of an order for programming the pages of a set of memory cells in a block. The table provides the order for programming with respect to four word lines (WL0, WL1, WL2 and WL3) in the same block; however, the table can be adapted to accommodate more or less than four word lines. The first page of the memory cells connected to WL0 are programmed, followed by the programming of the first page of the memory cells connected to WL1, followed by the programming of the second page of the memory cells connected to WL0, followed by the programming of the first page of the memory cells connected to WL2, followed by the programming of the second page of the memory cells connected to WL1, followed by the programming of the third page of the memory cells connected to WL0, followed by the programming of the first page of the memory cells connected to WL3, followed by the programming of the second page of the memory cells connected to WL2, followed by the programming of the third page of the memory cells connected to WL1, etc.

Figure 9A:
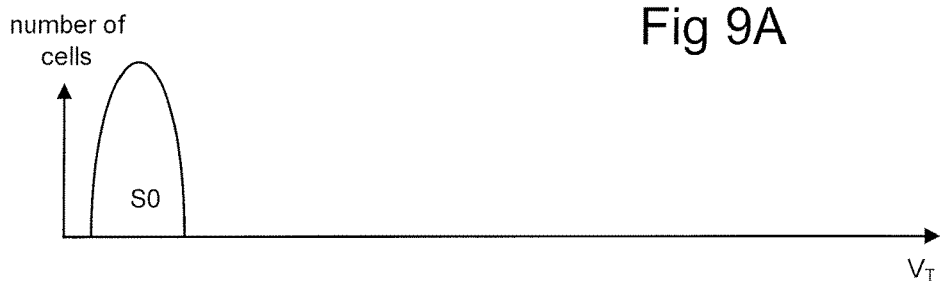
Figure 9B:
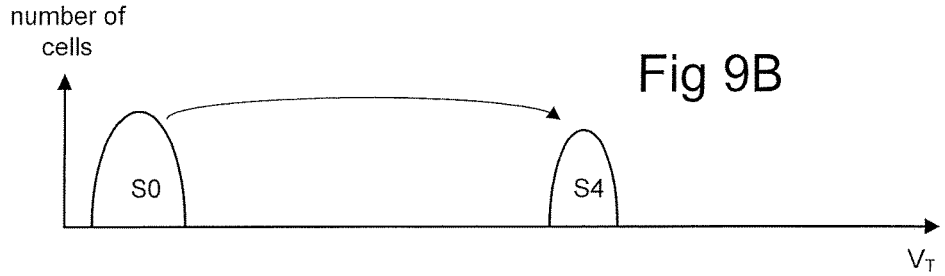
Figure 9C:
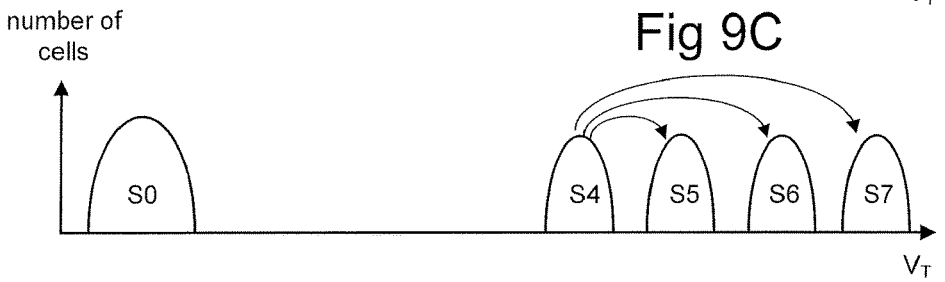
Figure 9D:
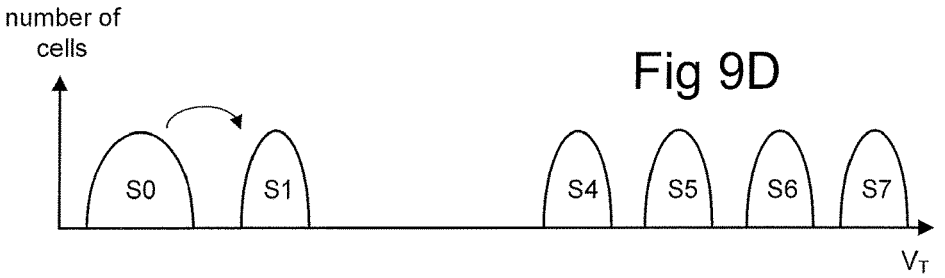
Figure 9E:
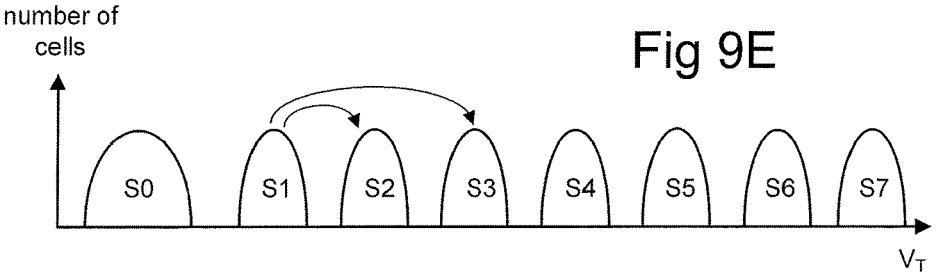

FIGS. 9A-E disclose another process for programming non-volatile memory for non-volatile memory cells that store three bits of data per memory cell and uses four steps. Before programming, all of the memory cells are in state S0, the erased state (FIG. 9A). The first step includes programming the memory cells for the higher states S4-S7. FIG. 9B shows programming to state S4 for those memory cells that are to be finally programmed to S4-S7. FIG. 9C shows the second step, which includes programming from state S4 to states S5-S7. FIG. 9D shows the third step, which includes programming from state S0 to state S1. FIG. 9E shows the fourth step, which includes programming from state S1 to states S2 and S3.

FIG. 10 is a flow chart describing a programming process for programming memory cells connected to a selected word line. In one embodiment, the process of FIG. 10 is used to program a block of memory cells. In one implementation of the process of FIG. 10, memory cells are pre-programmed in order to maintain even wear on the memory cells (step 550). In one embodiment, the memory cells are preprogrammed to state S7, a random pattern, or any other pattern. In some implementations, pre-programming need not be performed.

In step 552, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. A strong electric field is thus applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of the selected memory cells are lowered. Erasing can be performed on the entire memory array, on individual blocks, or another unit of cells. In one embodiment, after erasing the memory cells, all of the erased memory cells will be in state S0. Other techniques for erasing can also be used.

At step 554, soft programming is performed to narrow the distribution of erased threshold voltages for the erased memory cells. Some memory cells may be in a deeper erased state than necessary as a result of the erase process. Soft programming can apply programming pulses to move the threshold voltage of the deeper erased memory cells to state S0 (or state E). In step 556, the memory cells of the block are programmed as described herein. The process of FIG. 10 can be performed at the direction of the state machine, controller or combination of state machine and controller, using the various circuits described above. For example, the controller may issue commands and data to the state machine to program the data. In response, the state machine may operate the circuits described above to carry out the programming operations. After performing the process of FIG. 10, the memory cells of the block can be read.

FIG. 11 is a flow chart describing one embodiment of a process for performing programming on memory cells connected to a common word line. The process of FIG. 11 can be performed one or multiple times during step 556 of FIG. 10. For example, when programming binary data (see e.g., FIG. [6] *6A*), the process of FIG. 11 is performed once for each word line of a block during step 556. When programming multi-state data, the process of FIG. 11 can be used to perform the full sequence programming of FIG. [6] *6A*, in which case the process of FIG. 11 would be performed once for each word line. In one embodiment, the programming process is performed in an order that starts from the word line closest to the source line, working toward the bit line. The process of FIG. 11 can also be used to perform the programming of a page of data for a word line, with respect to the programming process of FIGS. 7A-I, in which case the process of FIG. 11 would be performed three times for each word line. The process of FIG. 11 can also be used to separately perform each step of the four steps of FIGS. 9A-9E. The process of FIG. 11 is performed at the direction of the state machine 222.

Typically, the program voltage applied to the control gate during a program operation is applied as a series of program pulses. In between programming pulses are a set of verify pulses to enable verification. In many implementations, the magnitude of the program pulses is increased with each successive pulse by a predetermined step size. In step 608 of FIG. 11, the programming voltage (Vpgm) is initialized to the starting magnitude (e.g., ~12-16V or another suitable level) and a program counter PC maintained by state machine 222 is initialized at 1. In step 610, a program pulse of the program signal Vpgm is applied to the selected word line (the word line selected for programming). The unselected word lines receive one or more boosting voltages (e.g., ~9 volts) to perform boosting schemes known in the art. If a memory cell should be programmed, then the corresponding bit line is grounded. On the other hand, if the memory cell should remain at its current threshold voltage, then the corresponding bit line is connected to $V_{DD}$ to inhibit programming. More information about boosting schemes can be found in U.S. Pat. No. 6,859,397 and U.S. patent application Ser. No. 11/555,850, both of which are incorporated herein by reference.

In step 610, the program pulse is concurrently applied to all memory cells connected to the selected word line so that all (or a subset) of the memory cells connected to the selected word line are programmed together. That is, they are programmed at the same time (or during overlapping times). In this manner all of the memory cells connected to the selected word line will concurrently have their threshold voltage change, unless they have been locked out from programming.

In step 612, the states of the selected memory cells are verified using the appropriate set of target levels. Step 612 of FIG. 10 includes performing one or more verify operations. In general, during verify operations and read operations, the selected word line is connected to a voltage, a level of which is specified for each read (e.g., see read compare levels Vr1, Vr2, Vr3, Vr4, Vr5, Vr6, and Vr7 of FIG. [6A] *6B*) or verify operation (e.g. see verify levels Vv1, Vv2, Vv3, Vv4, Vv5, Vv6 and vv7 of FIG. [6A] *6B*) in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge the corresponding bit line. The voltage on the bit line is measured after a period of time to see whether it has been discharged or not. Note that the technology described herein can be used with different methods known in the art for verifying/reading. More information about verifying/reading can be found in the following patent documents that are incorporated herein by reference in their entirety: (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; and (4) U.S. Patent Publication 2006/0221692, titled "Compensating for Coupling During Read Operations of Non-Volatile Memory," Inventor Jian Chen, filed on Apr. 5, 2005.

If it is detected that the threshold voltage of a selected memory cell has reached the appropriate target level, then the memory cell is locked out of further programming by, for example, raising its bit line voltage to Vdd during subsequent programming pulses.

Looking back at FIG. 11, in step 614 it is checked whether all of memory cells have reached their target threshold voltages. If so, the programming process is complete and successful because all selected memory cells were programmed and verified to their target states. A status of "PASS" is reported in step 616. Note that in some implementations, in step 614 it is checked whether at least a predetermined number of memory cells have been properly programmed. This predetermined number can be less than the number of all memory cells, thereby allowing the programming process to stop before all memory cells have reached their appropriate verify levels. The memory cells that are not successfully programmed can be corrected using error correction during the read process.

If, in step 614, it is determined that not all of the memory cells have reached their target threshold voltages, then the programming process continues. In step 618, the program counter PC is checked against a program limit value (PL). One example of a program limit value is 20; however, other values can be used. If the program counter PC is not less than the program limit value, then it is determined in step 630 whether the number of memory cells that have not been successfully programmed is equal to or less than a predetermined number. If the number of unsuccessfully programmed memory cells is equal to or less than the predetermined number, then the programming process is considered successful and a status of PASS is reported in step 632. In many cases, the memory cells that are not successfully programmed can be corrected using error correction during the read process. If however, the number of unsuccessfully programmed memory cells is greater than the predetermined number, the program process is considered as failed and a status of FAIL is reported in step 634.

If, in step 618, it is determined that the Program Counter PC is less than the Program Limit value PL, then the process continues at step 620 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 620, the process loops back to step 610 and another program pulse is applied to the selected word line.

To provide the user of the memory system with faster programming performance, the memory system first stores data as binary data. For example, the process of FIGS. 10 and 11 are used to store data as depicted in FIG. [6] *6A* (or as in another scheme). Subsequently, the binary data is re-programmed as multi-state data. When re-programming the binary data as multi-state data the processes of FIGS. 10 and 11 can be used to implement the programming schemes of FIGS. [6A] *6B*, 7A-I, 9A-E, or another scheme. For example, if a file to be stored contains three blocks of data, those blocks of data will first be stored as binary data in three separate blocks. Subsequently, three blocks if binary data will be re-programmed into a single block as multi-state data with three bits per memory cell. With such an embodiment, the user of the device will experience fast programming without giving up long term storage density.

In one embodiment, the system tries to first use the block of memory cells to store binary data. After X cycles of erasing and storing binary data, a particular block will then be used to store multi-state data. In one example implementation, the value of X will be the number of bits data stored in each memory cell. For example, if the memory cells store three bits of multi-state data, then a given block will be used to store binary data three times. After the third time binary data is stored in the given block, that given block will then be used to store multi-state data. Other values for X can also be used.

FIG. 12 is a flow chart describing one embodiment of a process for first storing data as binary data and subsequently storing the data as multi-state data. In step 702, the system (controller, state machine, or other component) will receive one or more requests to program data. The data to be programmed will also be received. In step 704, the data is programmed as binary data into block that have not yet been programmed with multi-state data and not yet been programmed with binary data X times. In one embodiment, step 704 includes identifying blocks that have not yet been programmed with multi-state data and not yet been programmed with binary data X times, and then using the process of FIGS. 10 and 11 to program data as depicted in FIG. [6] *6A*. The number of blocks used will depend on the amount of data to be programmed.

Once the data has been written in step 704, the system can report that the programming process is complete and/or start another programming process. Thus, the user or host will experience the fast programming of binary data.

In order to program the data into blocks that have not yet been programmed with binary data more than X times, the system needs to keep track of how many times each block is programmed with binary data. In one embodiment, the controller (or the state machine or another device) maintains a cycle count for each block that indicates how many times each block has been programmed with binary data. In step 706 of FIG. 12, the appropriate one or more cycle counts for the block programmed in step 704 are incremented.

In step 708, data from multiple blocks storing binary data (the source blocks) are transferred to a new block (target block) by combining the data and storing that data in the new block as multi-state data. If the multi-state data includes two bits per memory cell, then binary data from two blocks will be transferred to one block of multi-state data. If the multi-state data includes three bits per memory cell, then binary data from three blocks will be transferred to one block of multi-state data. If the multi-state data includes four bits per memory cell, then binary data from four blocks will be transferred to one block of multi-state data. If the multi-state data includes X bits per memory cell, then binary data from X blocks will be transferred to one block of X bit multi-state data.

In one embodiment, the block that will be used to store the multi-state data will be a block that has been used X times to program binary data. Initially, it may be necessary to program multi-state data into a block that has not yet been used X times to program binary data.

In one embodiment, the transfer of data from the blocks storing binary data to a block storing multi-state data (step 708) is performed as soon as there is enough data to fill up a multi-state block. In another embodiment, the transfer of data from the blocks storing binary data to a block storing multi-state data (step 708) is performed during times when the memory system is idle and there is enough data to fill up a multi-state block. For example, the memory system can periodically test whether its idle and perform step 708 in response to determining that it is idle. Other times can also be used.

In one embodiment, each block will include a valid data flag that will indicate whether that block has valid data. That flag can be stored in a memory cell, in a register with the state machine or in a register (or memory location) with the controller. When binary data is written in step 704, the appropriate valid data flags are set to indicate that the blocks written to have valid binary data. After the binary data is re-programmed to multi-state data in a different block, the appropriate valid data flag is reset in step 710 to indicate that the data in the block is not valid and, therefore, the block can be used to program other data.

FIG. 13 is a flow chart describing an example implementation of a system for first storing data as binary data and subsequently storing the data as three bit per memory cell multi-state data. In step 750 of FIG. 13, the system (controller, state machine, or other component) will receive one or more requests to program data. The data to be programmed will also be received. The controller, state machine, or other component will determine whether there are blocks that do not currently store valid data and have been programmed with binary data one or two times (step 752). If so, then in step 754 the data received in step 750 is programmed as binary data in the block(s) identified in step 752. If, in step 752, it is determined that there are no blocks that do not currently store valid data and have been programmed with binary data one or two times, then the data received in step 750 is programmed in step 756 as binary data in one or more blocks not yet used for programming. The blocks can be chosen in number order, or another method. After steps 754 and 756, the cycle counts and the valid data flags for the blocks used to program data are updated accordingly in step 758. In some embodiment, the system will report to the user or host that the programming of the block has completed so that additional programming can be performed.

In step 760 of FIG. 13, it is determined whether there are three blocks that currently store valid binary data. If not, the process is complete. If there are three blocks that currently store valid binary data, then the process will continue at step 762 to re-program that binary data as multi-state data. Note that FIG. 13 shows step 760 being performed right after step 758. In some embodiment, the system will wait until it's idle to perform step 760.

In step 762, it is determined whether there is a block that does not have valid data and has been previously programmed with binary data three times. This inquiry is performed by checking the valid data flags and cycle counts for the blocks. If a block is identified that does not currently have valid, but has been previously programmed with binary data three times, then a multi-state programming process will be used in step 764 to program binary data from the three blocks identified in step 760 to the one block identified in step 762. For example, the processes of FIGS. 10 and 11 can be used to implement the programming schemes of FIGS. 6A, 7A-I, 9A-E, or another scheme. After the binary data is re-programmed to multi-state data in a different block, the appropriate valid data flag is reset in step 766 to indicate that the data in the block is not valid and, therefore, the block can be used to program other data.

If, in step 762, it is determined that there are no blocks that do not have valid data and has been previously programmed with binary data three times, then a multi-state programming process will be used in step 768 to program binary data from the three blocks identified in step 760 to a fresh block (or a block programmed one or two times). For example, the processes of FIGS. 10 and 11 can be used to implement the programming schemes of FIGS. 6A, 7A-I, 9A-E, or another scheme. After performing the multi-state programming process of step 768, the valid data flags will be updated in step 766. Steps 764 and 768 can use any of the multi-state programming schemes described above, all we as others suited for the particular implementation.

In one embodiment, after step 766 the process loops back to re-program other data. In some embodiment, step 760-768 are performed repeatedly during times that the system is idle.

FIGS. 14A, 14B and 15 provide an example of the order of programming a set of blocks in a non-volatile storage system that operates according to the process of FIG. 13. FIGS. 14A and 14B depict a flow chart describing the order of programming. FIG. 15 is a table that depicts the contents of the block during each operation described in FIGS. 14A and 14B. Each column of FIG. 15 pertains to a block of memory in memory array 200. Although FIG. 15 only shows fifteen blocks, most memory arrays will include many more than fifteen blocks. Each row of FIG. 15 pertains to a programming operation. A blank box in FIG. 15 indicates that the block does not store valid data. A "b1" in a box indicates that the block is storing binary data and the block has only been programmed once. A "b2" in a box indicates that the block is storing binary data and the block has been programmed twice. A "b3" in a box indicates that the block is storing binary data and the block has been programmed three times. An "ms" in a box indicates that the block is storing multi-state data. Note that FIGS. 14A, 14B and 15 provide only one example and many other embodiments for ordering the programming can also be used.

Before any of the programming operations of FIG. 14A, none of the blocks will be storing valid data. Each of the operations includes performing the process of FIG. 13. Operation 1 will program first binary data (b1) into block 0. Operation 2 will program first binary data (b1) into block 1. Note that during operation 1 and operation 2, the test at step 760 of FIG. 13 will be negative and, therefore, the process of FIG. 13 will be completed after programming the binary data. After operation 2, FIG. 15 shows blocks 0 and 1 storing first binary data b1. Operation 3 will program first binary data (b1) into block 2. Note that although the reference "b1" is depicted for blocks 0-2, the reference "b1" is meant to indicate that binary data is stored and it is the first time that binary data is stored for that block. The reference "b1" is not meant to indicate the contents of the data and it is likely (but not required) that the data stored in each block is different from data stored in other blocks. At this point during operation 23, FIG. 15 shows blocks 0, 1 and 2 storing first binary data b1. After binary data is programmed into block 2 during operation 3, the test at step 760 of FIG. 13 will be positive; therefore, operation 3 will also include using a multi-state programming process (see step 768) to program binary data from the blocks 0, 1 and 2 into block 3 (a fresh block). After operation 3 has completed, FIG. 15 shows block 3 storing multi-state data ms, and blocks 0-2 do not store valid data (because the valid data flags have been updated).

Operation 4 will program second binary data (b2) into block 0. Operation 5 will program second binary data (b2) into block 1. Operation 6 will program second binary data (b2) into block 2. Operation 6 will also include using a multi-state programming process (see step 768) to program binary data from the blocks 0, 1 and 2 into block 4 (a fresh block).

Operation 7 will program third binary data (b3) into block 0. Operation 8 will program third binary data (b3) into block 1. Operation 9 will program third binary data (b3) into block 2. Operation 9 will also include using a multi-state programming process (see step 768) to program binary data from the blocks 0, 1 and 2 into block 5 (a fresh block).

At this point, blocks 0, 1 and 2 have been used three times to store binary data; therefore, they will not be programmed again with binary data. Instead, they will be programmed with multi-state data.

Operation 10 will program first binary data (b1) into block 6. Operation 11 will program first binary data (b1) into block 7. Operation 12 will program first binary data (b1) into block 8. Operation 12 will also include using a multi-state programming process to program binary data from the blocks 6, 7 and 8 into multi-state data. When the test of step 762 is performed, there will be three blocks (blocks 0, 1 and 2) that do not have valid data and have been programmed with binary data three times. One of these blocks will be chosen. In one embodiment, they are chosen in number order. Therefore, in step 764, during operation 12, block 0 will be programmed with multi-state data based on the binary data from blocks 6, 7 and 8.

Operation 13 will program second binary data (b2) into block 6. Operation 14 will program second binary data (b2) into block 7. Operation 15 will program second binary data (b2) into block 8. Operation 15 will also include using a multi-state programming process (see step 764) to program binary data from the blocks 6, 7 and 8 into block 1 as multi-state data.

Operation 16 will program third binary data (b3) into block 6. Operation 17 will program third binary data (b3) into block 7. Operation 18 will program third binary data (b3) into block 8. Operation 18 will also include using a multi-state programming process (see step 764) to program binary data from the blocks 6, 7 and 8 into block 2.

Operation 19 will program first binary data (b1) into block 9. Operation 20 will program first binary data (b1) into block 10. Operation 21 will program first binary data (b1) into block 11. Operation 21 will also include using a multi-state programming process (see step 764) to program binary data from the blocks 9, 10 and 11 into block 6.

Operation 22 will program second binary data (b2) into block 9. Operation 23 will program second binary data (b2) into block 10. Operation 24 will program second binary data (b2) into block 11. Operation 24 will also include using a multi-state programming process (see step 764) to program binary data from the blocks 9, 10 and 11 into block 7.

Operation 25 will program third binary data (b3) into block 9. Operation 26 will program third binary data (b3) into block 10. Operation 27 will program third binary data (b3) into block 11. Operation 27 will also include using a multi-state programming process (see step 764) to program binary data from the blocks 9, 10 and 11 into block 8.

Operation 28 will program first binary data (b1) into block 12. Operation 29 will program first binary data (b1) into block 13. Operation 30 will program first binary data (b1) into block 14. Operation 30 will also include using a multi-state programming process (see step 764) to program binary data from the blocks 12, 13 and 14 into block 9. This process will continue until all of the blocks that can be programmed are programmed as described herein.

Although the above example of multi-state data included three bits per memory cell, the technology described herein can be used with other multi-state data. For example, the technology described herein can be used with memory cells that store two bits of data, four bits of data, five bits of data, etc.

The above-described embodiments operate on blocks of memory cells. However, other units of memory cells can also be used when first programming as binary data and then programming as multi-state data.

The above-described processes for programming data as binary data and then re-programming as multi-state data will attempt to program block X times as binary data and then once as multi-state data. At some point, the memory array will be filled with data. In one embodiment, the memory system is an archival system and the multi-state data will never be over-written. Instead, it will be maintained for a very long period and read many times.

In another embodiment, the memory system can be re-initialized or re-formatted such that all data is erased, all flags reset, and all cycle counts reset to 0. At that point, the processes of FIGS. 12 and/or 13 can be repeated.

Other uses can also be utilized with the technology described herein.

The technology described herein provides many advantages. For example, programming binary data is faster than programming multi-state data so the user experiences faster programming times due to the multi-state programming happening later in the background. The system described above allows the data integrity to be checked for the programmed MLC data prior to deleting the binary data. All of the multi-state data for a block can be written at the same time so that all word lines of a block have the same data retention charge loss experience and are programmed at the same temperature. In this way, we can learn the characteristics of all the word lines in a block by sampling one word line or a subset. Additionally, binary blocks can be written in very small chunks by allowing partial page programming in binary blocks, where binary blocks are resilient to exposure to multiple program disturb conditions (caused by several partial page programming events) by virtue of being binary.

When not using the technology described herein and initially programming multi-state data, the various pages of data need to be written more carefully and slowly so that a page is readable even if not all pages have been programmed. By programming in binary initially, the programming speed experienced by the user is much shorter.

In one embodiment, a flash memory chip that was designed to store four bits per memory cell can be used to implement the technology described herein to program data as binary and then as three bits per memory cell multi-state data. So, for example, using a memory chip with a capacity of 8 GB at four bits per memory cell will have a capacity of 6 GB when storing three bits per memory cell using the technology described herein. Some systems use four memory chips (four memory arrays) with one controller. Using four 6 GB memory arrays will create a system with 24 GB of storage. Some flash memory chips that store four bits make use of a binary data cache in the flash memory array. When using the technology described herein, the real estate in the memory array used for the cache can be reclaimed for general user data.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method of programming for a non-volatile storage system, comprising: programming data as binary data into units of non-volatile storage elements that have not yet been programmed with multi-state data and have not yet been programmed with binary data a specific number of times; and transferring data from multiple units of non-volatile storage elements storing binary data to one target unit of non-volatile storage elements storing multi-state data using a multi-state programming process after the target unit has been previously programmed with binary data the specific number of times.

2. The method of claim 1, further comprising:

incrementing cycle counts for units subjected to programming of binary data;

marking units as valid in response to programming of binary data and programming of multi-state data; and marking units as invalid when binary data in the units is transferred to multi-state data.

3. The method of claim 1, wherein the programming data as binary data comprises:

determining that a set of units of non-volatile storage elements have not been subjected to binary programming the specific number of times; and performing a binary programming process to store the data as binary data in the set of units of non-volatile storage elements.

4. The method of claim 1, wherein the programming data as binary data comprises:

determining that a set of the specific number of units of non-volatile storage elements have not been subjected to binary programming the specific number of times; and performing a binary programming process to store the data as binary data in the set of the specific number of units of non-volatile storage elements.

5. The method of claim 1, wherein the programming data as binary data comprises determining that units of non-volatile storage elements have not been subjected to binary programming the specific number of times.

6. The method of claim 1, wherein the transferring data from multiple units of non-volatile storage elements storing binary data comprises:

determining that a specific unit of non-volatile storage elements has been previously programmed with binary data the specific number of times;

reading binary data from a set of units of non-volatile storage elements;

combining the binary data from the set of units of non-volatile storage elements into one set of multi-state data; and programming the one set of multi-state data into the specific unit of non-volatile storage elements.

7. The method of claim 1, wherein the transferring data from multiple units of non-volatile storage elements storing binary data comprises:

determining that a specific unit of non-volatile storage elements has been previously programmed with binary data the specific number of times;

reading binary data from a set of the specific number of units of non-volatile storage elements; and combining the binary data from the set of the specific number of units of non-volatile storage elements into the specific number of bits of multi-state data; and programming the specific number of bits of multi-state data into the specific unit of non-volatile storage elements.

8. The method of claim 1, wherein the transferring data from multiple units of non-volatile storage elements storing binary data comprises determining that a specific unit of non-volatile storage elements has been programmed with binary data the specific number of times.

9. The method of claim 1, wherein:

determining that the non-volatile storage system is idle, the transferring data from multiple units of non-volatile storage elements storing binary data to one target unit of non-volatile storage elements is performed is response to determining that the non-volatile storage system is idle.

10. The method of claim 1, wherein:

the programming data as binary data comprises determining that a set of units of non-volatile storage elements have not been subjected to binary programming the specific number of times and performing a binary programming process to store the data as binary data in the set of units of non-volatile storage elements; and the transferring data from multiple units of non-volatile storage elements storing binary data comprises determining that a specific unit of non-volatile storage elements has been programmed with binary data the specific number of times, reading binary data from a set of the specific number of units of non-volatile storage elements, combining the binary data from the set of the specific number of units of non-volatile storage elements into one set of the specific number of bits of multi-state data and programming the one set of the specific number of bits of multi-state data into the specific unit of non-volatile storage elements.

11. The method of claim 10, wherein:

determining that the non-volatile storage system is idle, the transferring data from multiple units of non-volatile storage elements storing binary data to one target unit of non-volatile storage elements is performed is response to determining that the non-volatile storage system is idle; and the method further comprises incrementing cycle counts for units subjected to programming of binary data, marking units as valid in response to programming of binary data and programming of multi-state data and marking units as invalid when binary data in the units is transferred to multi-state data.

12. The method of claim 1, further comprising:

formatting the non-volatile storage system; and repeating the steps of programming data and transferring data.

13. The method of claim 1, wherein:

the specific number is equal to the number of bits of data stored in the non-volatile storage elements.

14. A method of programming for a non-volatile storage system, comprising:

programming data as binary data into units of non-volatile storage elements that have not yet been programmed with multi-state data and have not yet been programmed with binary data three times; and transferring data from multiple units of non-volatile storage elements storing binary data to one target unit of non-volatile storage elements storing multi-state data using a multi-state programming process after the target unit has been previously programmed with binary data three times.

15. The method of claim 1, wherein:

the units of non-volatile storage elements are blocks of non-volatile storage elements.

16. The method of claim 1, wherein:

the non-volatile storage elements are flash memory devices.

17. A method of programming for a non-volatile storage system, comprising:

receiving one or more requests to program;

receiving data to be programmed for the one or more requests;

in response to the one or more requests to program, programming the data as binary data into multiple units of non-volatile storage elements that have not yet been programmed with multi-state data and have not yet been programmed with binary data a specific number of times;

updating programming cycle counters for the units of non-volatile storage elements;

identifying a target unit of non-volatile storage elements that has been previously programmed with binary data the specific number of times;

combining data from the multiple units of non-volatile storage elements storing binary data and storing the combined data in the target unit of non-volatile storage elements as multi-state data using a multi-state programming process; and marking the multiple units of non-volatile storage elements as available for additional binary programming if the multiple units of non-volatile storage elements have not yet been programmed with binary data the specific number of times.

18. The method of claim 17, further comprising:

formatting the non-volatile storage system subsequent to the programming the data.

19. The method of claim 17, wherein:

the specific number is equal to the number of bits of data stored in the non-volatile storage elements.

20. The method of claim 17, further comprising:

identifying the units of non-volatile storage elements that have not yet been programmed with multi-state data and have not yet been programmed with binary data the specific number of times.

21. The method of claim 17, wherein:

determining that the non-volatile storage system is idle, the combining data and storing the combined data is performed in response to determining that the non-volatile storage system is idle.

22. A non-volatile storage apparatus, comprising:

a plurality of non-volatile storage elements; and one or more control circuits in communication with the non-volatile storage elements, the one or more control circuits identify a first set of units of the non-volatile storage elements that have not yet been programmed with multi-state data and have not yet been programmed with binary data a specific number of times, the one or more control circuits program first data as binary data into the first set of units of the non-volatile storage elements, the one or more control circuits identify a target unit of non-volatile storage elements that has been previously programmed with binary data the specific number of times, the one or more control circuits combine the first data from the first set of units of non-volatile storage elements and store the combined data in the target unit of non-volatile storage elements as multi-state data.

23. A non-volatile storage apparatus according to claim 22, wherein:

the one or more control circuits increment cycle counts for units subjected to programming of binary data;

the one or more control circuits mark units as valid in response to programming of binary data and programming of multi-state data; and the one or more control circuits mark units as invalid when binary data in the units is transferred to multi-state data.

24. A non-volatile storage apparatus according to claim 22, wherein:

the specific number is equal to the number of bits of data stored in the non-volatile storage elements and the number of units in the first set of units.

25. A non-volatile storage apparatus according to claim 22, wherein:

the non-volatile storage elements are NAND flash memory devices.

26. The method of claim 1, wherein:

the specific number is greater than zero.

27. The method of claim 1, wherein:

the specific number is greater than one.

*28. The method of claim 1, wherein:*

*the multiple units of non-volatile storage elements comprise a three-dimensional array of storage elements.*

*29. The method of claim 1, wherein:*

*the multiple units of non-volatile storage elements comprise a three-dimensional array of memory cells.*

*30. The method of claim 1, wherein:*

*the multiple units of non-volatile storage elements are arranged in a three-dimensional memory structure.*

*31. The method of claim 14, wherein:*

*the multiple units of non-volatile storage elements comprise a three-dimensional array of storage elements.*

*32. The method of claim 14, wherein:*

*the multiple units of non-volatile storage elements comprise a three-dimensional array of memory cells.*

*33. The method of claim 14, wherein:*

*the multiple units of non-volatile storage elements are arranged in a three-dimensional memory structure.*

*34. The method of claim 17, wherein:*

*the multiple units of non-volatile storage elements comprise a three-dimensional array of storage elements.*

*35. The method of claim 17, wherein:*

*the multiple units of non-volatile storage elements comprise a three-dimensional array of memory cells.*

*36. The method of claim 17, wherein:*

*the multiple units of non-volatile storage elements are arranged in a three-dimensional memory structure.*

*37. The non-volatile storage apparatus of claim 22, wherein:*

*the plurality of non-volatile storage elements comprise a three-dimensional array of storage elements.*

*38. The non-volatile storage apparatus of claim 22, wherein:*

*the plurality of non-volatile storage elements comprise a three-dimensional array of memory cells.*

*39. The non-volatile storage apparatus of claim 22, wherein:*

*the plurality of non-volatile storage elements are arranged in a three-dimensional memory structure.*

* * * * *